(12) United States Patent
Mathe et al.

(10) Patent No.: US 9,837,962 B2
(45) Date of Patent: Dec. 5, 2017

(54) ENVELOPE TRACKER WITH VARIABLE BOOSTED SUPPLY VOLTAGE

(71) Applicant: QUALCOMM Incorporated, San Diego, CA (US)

(72) Inventors: Lennart Karl-Axel Mathe, San Diego, CA (US); Yunfei Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 209 days.

(21) Appl. No.: 13/911,902

(22) Filed: Jun. 6, 2013

(65) Prior Publication Data
US 2014/0361830 A1 Dec. 11, 2014

(51) Int. Cl.
*H03G 3/20* (2006.01)
*H03F 1/02* (2006.01)
*H03F 3/195* (2006.01)

(52) U.S. Cl.
CPC ............ *H03F 1/02* (2013.01); *H03F 1/0222* (2013.01); *H03F 1/0227* (2013.01); *H03F 3/195* (2013.01); *H03F 2200/102* (2013.01); *H03F 2200/432* (2013.01); *H03F 2200/435* (2013.01); *H03F 2200/504* (2013.01)

(58) Field of Classification Search
CPC ...................................................... H03F 1/0238
USPC ......................................... 330/127, 136, 297
See application file for complete search history.

(56) References Cited

U.S. PATENT DOCUMENTS

| 4,433,307 A | 2/1984 | Yokoyama |
| 8,030,995 B2 * | 10/2011 | Okubo et al. ................. 330/127 |
| 8,089,253 B2 | 1/2012 | Murtojarvi |
| 8,493,141 B2 * | 7/2013 | Khlat ................... H03F 1/0244 327/536 |

(Continued)

FOREIGN PATENT DOCUMENTS

| CN | 101079602 A | 11/2007 |
| CN | 102629854 A | 8/2012 |

OTHER PUBLICATIONS

International Search Report and Written Opinion—PCT/US2014/040561—ISA/EPO—Nov. 5, 2014.

(Continued)

*Primary Examiner* — Khanh V Nguyen
*Assistant Examiner* — Khiem Nguyen
(74) *Attorney, Agent, or Firm* — Haynes and Boone, LLP

(57) ABSTRACT

Techniques for efficiently generating a variable boosted supply voltage for an amplifier and/or other circuits are disclosed. In an exemplary design, an apparatus includes an amplifier, a boost converter, and a boost controller. The amplifier receives an envelope signal and a variable boosted supply voltage and provides an output voltage and an output current. The boost converter receives a power supply voltage and at least one signal determined based on the envelope signal and generates the variable boosted supply voltage based on the power supply voltage and the at least one signal. The boost controller generates the at least one signal (e.g., an enable signal and/or a threshold voltage) for the boost converter based on the envelope signal and/or the output voltage. The boost converter is enabled or disabled based on the enable signal and generates the variable boosted supply voltage based on the power supply voltage and the threshold voltage.

22 Claims, 7 Drawing Sheets

(56) References Cited

U.S. PATENT DOCUMENTS

2012/0194274 A1    8/2012   Fowers et al.
2012/0200354 A1    8/2012   Ripley
2012/0326783 A1   12/2012   Mathe et al.

OTHER PUBLICATIONS

Kang D., et al., "A Multimode/Multiband Power Amplifier With a Boosted Supply Modulator", IEEE Ransactions on Microwave Theory and Techniques, IEEE Service Center, Piscataway, NJ, US, vol. 58, No. 10, Oct. 1, 2010 (Oct. 1, 2010), pp. 2598-2608, XP011317521, ISSN: 0018-9480.

Kim D., et al., "High efficiency and wideband envelope tracking power amplifier with sweet spot tracking", Radio Frequency Integrated Circuits Symposium (RFIC), 2010 IEEE, IEEE, Piscataway, NJ, USA, May 23, 2010 (May 23, 2010), pp. 255-258, XP031684103, ISBN: 978-1-4244-6240-7.

Nested and Multi-Nested Supply Modulator for an Envelope Tracing Power Apmplifier, RF Technology International, 2011-2012, Zhancang Wang, pp. 22-30 (8 pages).

\* cited by examiner

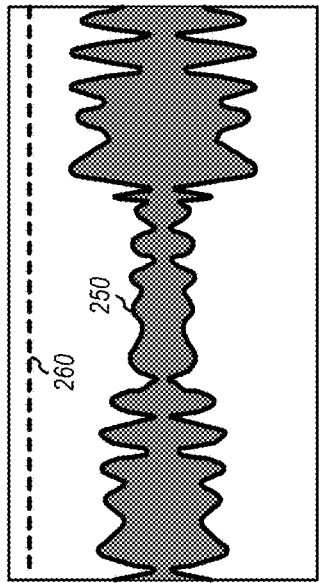
FIG. 2A
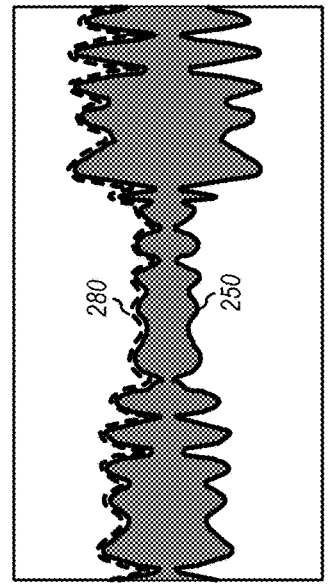
FIG. 2B
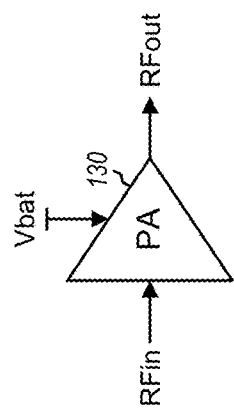
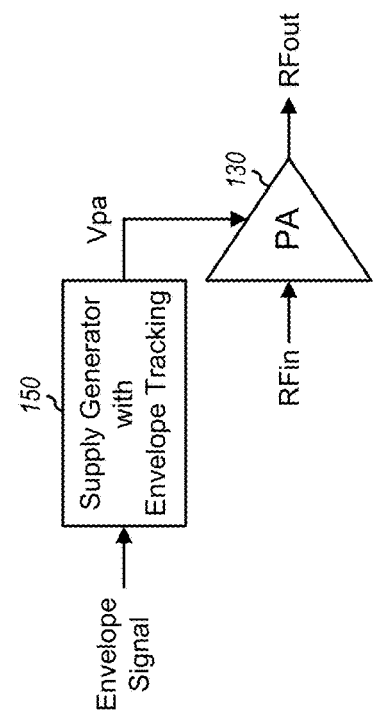

ENVELOPE TRACKER WITH VARIABLE BOOSTED SUPPLY VOLTAGE

BACKGROUND

I. Field

The present disclosure relates generally to electronics, and more specifically to techniques for generating a supply voltage for an amplifier and/or other circuits.

II. Background

In a communication system, a transmitter may process (e.g., encode and modulate) data to generate output samples. The transmitter may further condition (e.g., convert to analog, filter, frequency upconvert, and amplify) the output samples to generate an output radio frequency (RF) signal. The transmitter may then transmit the output RF signal via a communication channel to a receiver. The receiver may receive the transmitted RF signal and perform the complementary processing on the received RF signal to recover the transmitted data.

A transmitter typically includes a power amplifier (PA) to provide high transmit power for the output RF signal. The power amplifier should be able to provide high transmit power and have high power-added efficiency (PAE). Furthermore, the power amplifier may be required to have good performance and high PAE even with a low battery voltage.

SUMMARY

Techniques for efficiently generating a variable boosted supply voltage for an amplifier and/or other circuits are disclosed herein. In an exemplary design, an apparatus (e.g., an integrated circuit, a wireless device, or a circuit module) may include an amplifier and a boost converter. The amplifier may receive an envelope signal and a variable boosted supply voltage and provide an output voltage and an output current. The envelope signal may follow an envelope of an RF signal being transmitted. The variable boosted supply voltage may be used as a supply voltage for the amplifier. The boost converter may receive a power supply voltage (e.g., a battery voltage) and at least one signal determined based on the envelope signal and may generate the variable boosted supply voltage based on the power supply voltage and the at least one signal. The variable boosted supply voltage may be larger than the power supply voltage and may be adjustable.

The apparatus may further include a boost controller, which may generate the at least one signal for the boost converter based on the envelope signal and/or the output voltage. The boost controller may generate an enable signal based on the envelope signal and/or the output voltage. Alternatively or additionally, the boost controller may generate a threshold voltage for the boost converter based on the envelope signal and/or the output voltage and possibly based further on a headroom (e.g., a headroom voltage or a headroom current). The headroom may be dependent on the output current from the amplifier. The at least one signal may include the enable signal and/or the threshold voltage. The boost converter may be enabled or disabled based on the enable signal. The boost converter may generate the variable boosted supply voltage based on the power supply voltage and the threshold voltage. For example, the threshold voltage may be variable and determined based on (e.g., may be equal to) a sum of the envelope signal and the headroom. The variable boosted supply voltage may be equal or proportional to the threshold voltage.

Various aspects and features of the disclosure are described in further detail below.

BRIEF DESCRIPTION OF THE DRAWINGS

FIGS. 2A and 2B show diagrams of operating a power amplifier based on a fixed battery voltage and a variable supply voltage with envelope tracking, respectively.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for generating a variable boosted supply voltage for an amplifier and/or other circuits are disclosed herein. The techniques may be used for various types of amplifiers such as power amplifiers, driver amplifiers, buffers, etc. The techniques may also be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques to generate a variable boosted supply voltage for an envelope amplifier in a wireless communication device is described below.

Figure 1:
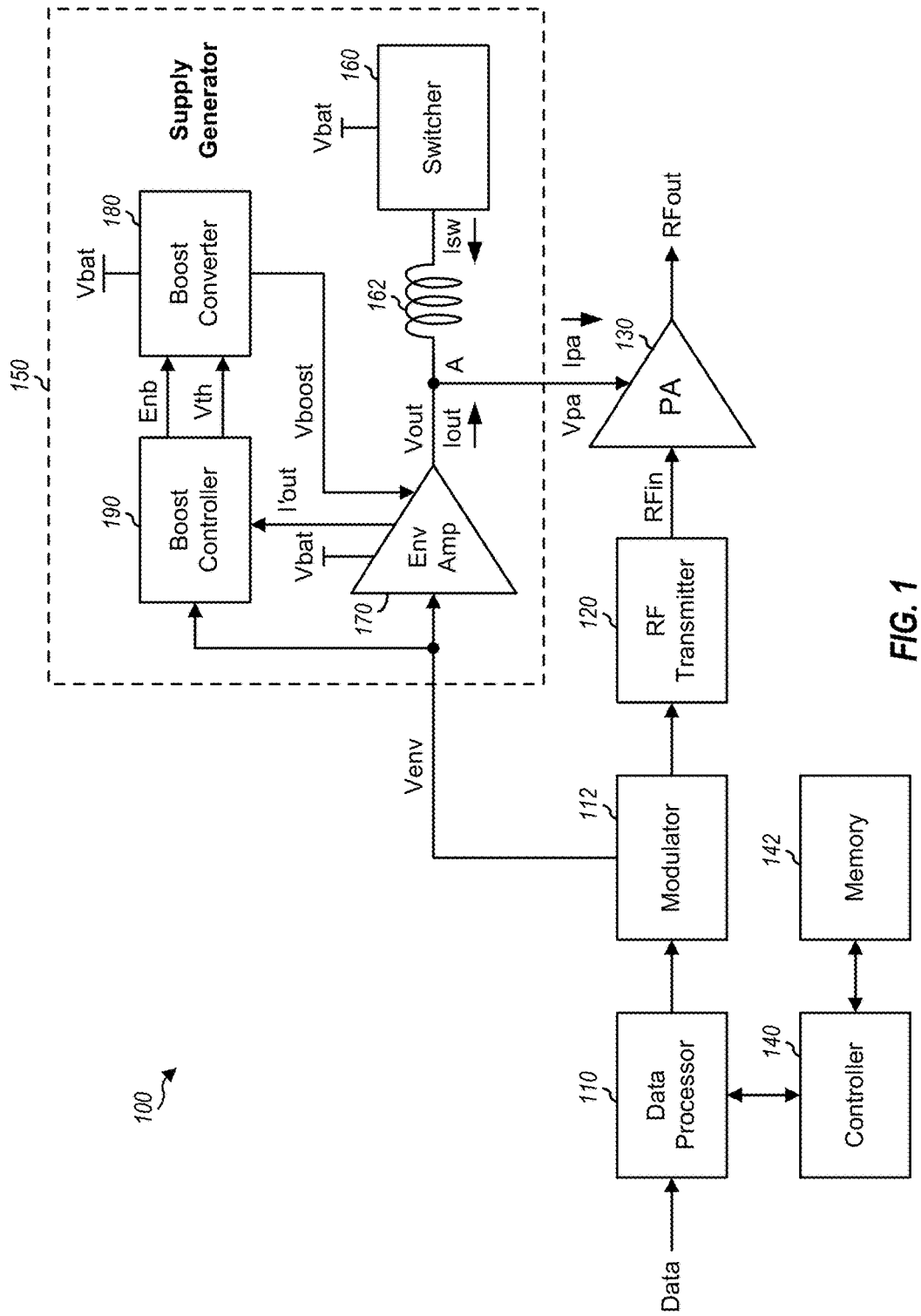
FIG. 1 shows a block diagram of a wireless communication device.

FIG. 1 shows a block diagram of an exemplary design of a wireless communication device 100. For clarity, only a transmitter portion of wireless device 100 is shown in FIG. 1, and a receiver portion is not shown in FIG. 1. Within wireless device 100, a data processor 110 may receive data to be transmitted, process (e.g., encode, interleave, and symbol map) the data, and provide data symbols. Data processor 110 may also process pilot and provide pilot symbols. Data processor 110 may further process the data symbols and pilot symbols for code division multiple access (CDMA), time division multiple access (TDMA), frequency division multiple access (FDMA), orthogonal FDMA (OFDMA), single-carrier FDMA (SC-FDMA), and/or some other multiplexing scheme and may provide output symbols.

A modulator 112 may receive the output symbols from data processor 110, perform quadrature modulation, polar modulation, or some other type of modulation, and provide output samples. Modulator 112 may also determine the envelope of the output samples. In an exemplary design, the envelope may be determined as follows:

$$e(t) = \text{avg}(\sqrt{I^2(t)+Q^2(t)}), \quad \text{Eq (1)}$$

where
- I(t) denotes an inphase (I) output sample in sample period t,
- Q(t) denotes a quadrature (Q) output sample in sample period t,
- e(t) denotes an envelope signal, and
- "avg" denotes an averaging operation.

In the design shown in equation (1), modulator 112 determines the envelope signal by computing the magnitude of each complex-valued output sample and averaging the magnitude across output samples. Modulator 112 may determine the envelope signal in other manners, e.g., based on other functions of the I and Q output samples. For example, multiple streams of output samples may be transmitted simultaneously (e.g., on multiple carriers for carrier aggregation), and modulator 112 may determine the envelope signal by (i) computing the power of each output sample stream as $P_k(t) = I_k^2(t) + Q_k^2(t)$, where $I_k(t)$ and $Q_k(t)$ denote I and Q samples and $P_k(t)$ denotes the power of the k-th output sample stream in sample period t, (ii) summing the powers of all output sample streams to obtain an overall power, or $$P(t) = \sum_k P_k(t),$$

and (iii) taking the square root of the overall power (and possibly averaging the result) to obtain an envelope signal, or $e(t) = \sqrt{P(t)}$. In general, modulator 112 may provide an envelope signal based on any function of the envelope of the output samples. An envelope signal may also be referred to as a power tracking signal.

An RF transmitter 120 may process (e.g., convert to analog, amplify, filter, and frequency upconvert) the output samples from modulator 112 and provide an input RF signal (RFin). A power amplifier (PA) 130 may amplify the input RF signal to obtain the desired transmit power level and provide an output RF signal (RFout), which may be transmitted via an antenna (not shown in FIG. 1). RF transmitter 120 may include circuits to generate the envelope signal, instead of using modulator 112 to generate the envelope signal.

A supply generator 150 may receive the envelope signal (Venv) from modulator 112 and may generate a supply voltage for power amplifier 130, which may be referred to as a PA supply voltage and denoted as Vpa. Supply generator 150 may also be referred to as an envelope tracker. In the design shown in FIG. 1, supply generator 150 includes a switcher 160, an envelope amplifier (Env Amp) 170, a boost converter 180, a boost controller 190, and an inductor 162. Switcher 160 may also be referred to as a switching-mode power supply (SMPS), a buck converter, etc. Switcher 160 receives a battery voltage (Vbat) and provides a first supply current (Isw) comprising direct current (DC) and low frequency components at node A. Inductor 162 stores the current from switcher 160 and provides the stored current to node A on alternating cycles. Boost converter 180 receives the Vbat voltage and a threshold voltage (Vth) and, when enabled by an enable (Enb) signal, generates a boosted supply voltage (Vboost) that is higher than the Vbat voltage. The Vboost voltage may be variable and may be dependent on the Vth voltage (e.g., Vboost≈Vth). Boost controller 190 generates the Vth voltage and the Enb signal based on the Venv signal and the Iout current (or a scaled version of the Iout current). The circuits in supply generator 150 are described in further detail below.

Envelope amplifier 170 receives the Venv signal at its signal input, receives the Vbat voltage and the Vboost voltage at its two supply inputs, and provides an output current (Iout) and an output voltage (Vout) comprising high frequency components at node A. A PA supply current (Ipa) provided to power amplifier 130 includes the Isw current from switcher 160 and the Iout current from envelope amplifier 170. Envelope amplifier 170 also provides the Vout voltage as the PA supply voltage for power amplifier 130. In general, a voltage may have a fixed value (e.g., Vbat) or a variable value (e.g., Vout). A voltage may vary over time and may be considered as a signal.

A controller 140 may control the operation of various units within wireless device 100. A memory 142 may store program codes and data for controller 140 and/or other units within wireless device 100. Data processor 110, modulator 112, controller 140, and memory 142 may be implemented on one or more application specific integrated circuits (ASICs) and/or other ICs.

FIG. 1 shows an exemplary design of wireless device 100. Wireless device 100 may also be implemented in other manners and may include different circuits than those shown in FIG. 1. All or a portion of RF transmitter 120, power amplifier 130, and supply generator 150 may be implemented on one or more analog integrated circuits (ICs), RF ICs (RFICs), mixed-signal ICs, etc.

FIG. 2A shows the use of a fixed battery voltage for power amplifier 130. The RFout signal (which follows the RFin signal) has a time-varying envelope and is shown by a plot 250. The battery voltage is shown by a plot 260 and is higher than the largest amplitude of the time-varying envelope in order to avoid clipping the RFout signal from power amplifier 130. The difference between the battery voltage and the envelope of the RFout signal represents wasted power that is dissipated by power amplifier 130 instead of delivered to an output load.

FIG. 2B shows generation of a variable supply voltage for power amplifier 130 with supply generator 150. Supply generator 150 receives the envelope signal indicative of the envelope of the RFout signal and generates the PA supply voltage (which is shown by a plot 280) for power amplifier 130 based on the envelope signal. The PA supply voltage closely tracks the envelope of the RFout signal over time. Hence, the difference between the PA supply voltage and the envelope of the RFout signal is small, which results in less wasted power. Power amplifier 130 may be operated in saturation for all RF signal amplitudes in order to improve PA efficiency.

Supply generator 150 can efficiently generate the PA supply voltage to track the envelope of the RFin signal provided to power amplifier 130, so that the PA supply voltage provided to power amplifier 130 has the proper magnitude/voltage, and the PAE of power amplifier 130 can be improved. Furthermore, supply generator 150 can generate the PA supply voltage with a low battery voltage. Wireless device 100 may operate with a low battery voltage in order to reduce power consumption, extend battery life, and/or obtain other advantages. However, power amplifier 130 may need to operate with a PA supply voltage that is higher than the battery voltage. For example, the battery voltage may be 2.5 volts (V), and the required PA supply voltage may be 3.2V. A boost converter may be used to boost the battery voltage to obtain a higher PA supply voltage. However, using the boost converter to directly provide the PA supply voltage may increase cost and power consumption, both of which may be undesirable.

Supply generator 150 can efficiently generate the PA supply voltage with a variable Vboost voltage in order to improve PAE of power amplifier 130 and avoid the disadvantages of using a boost converter to directly provide the PA supply voltage. This may be achieved by using a combination of (i) an efficient switcher 160 to generate a first supply current (Iind) comprising DC and low frequency components of the supply current to power amplifier 130 and (ii) a linear envelope amplifier 170 to generate a second supply current (Ienv) comprising high frequency components of the supply current to power amplifier 130. Switcher 160 may operate with the battery voltage and may provide the bulk of the power for power amplifier 130. Envelope amplifier 170 may operate with the variable Vboost voltage (if necessary) or the battery voltage (if possible) and may provide the remaining supply current to power amplifier 130. Boost converter 180 may generate a variable Vboost voltage of a desired magnitude/voltage for envelope amplifier 170 based on the Vth voltage. Supply generator 150 can generate the PA supply voltage to track the envelope of the RFin signal provided to power amplifier 130, so that the PA supply voltage of the proper magnitude/voltage is provided to power amplifier 130.

Figure 3:
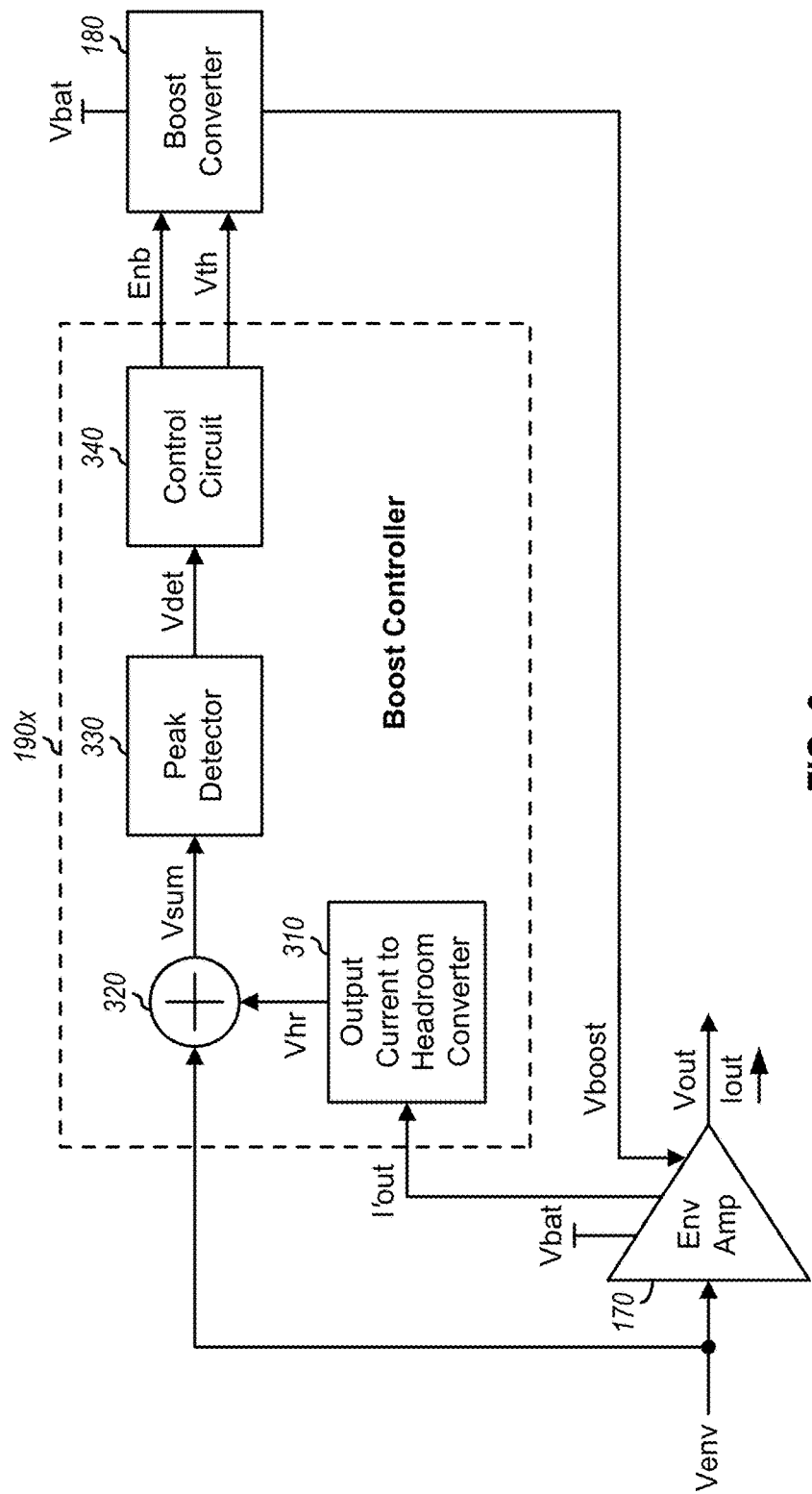
FIG. 3 shows a block diagram of a boost controller.

FIG. 3 shows a block diagram of a boost controller 190x, which is one exemplary design of boost controller 190 within supply generator 150 in FIG. 1. Envelope amplifier 170 may provide the Vout voltage and the Iout current at its output to power amplifier 130. Envelope amplifier 170 may include a sensing circuit that can sense the Iout current and provide a sensed output current (I'out). The I'out current may be equal to the Iout current (e.g., I'out≈Iout) or may be a scaled version of the Iout current (e.g., I'out≈K*Iout, where K≠1).

Boost controller 190x may receive the Venv voltage provided to envelope amplifier 170 and the I'out current from envelope amplifier 170. Within boost controller 190, an output current to headroom converter 310 may receive the I'out current and provide a headroom voltage (Vhr). A summer 320 may receive and sum the Venv voltage and the Vhr voltage and may provide a summed voltage (Vsum). A peak detector 330 may detect the peak of the Vsum voltage from summer 320 and may provide a detected peak voltage (Vdet). A control circuit 340 may receive the Vdet voltage and provide the Vth voltage based on the Vdet voltage. The Vth voltage may be equal to the Vdet voltage (e.g., Vth≈Vdet) or may be a scaled and/or a shifted version of the Vdet voltage (e.g., Vth≈Q*Vdet+Vos, where Q may be any scaling factor and Vos may be any offset voltage).

Control circuit 340 may also generate the Enb control signal based on the Vdet voltage. In an exemplary design, control circuit 340 may generate the Enb control signal to (i) enable boost converter 180 when the Vth voltage is greater than the Vbat voltage (or Vth>Vbat) or (ii) disable boost converter 180 when the Vth voltage is less than the Vbat voltage (or Vth<Vbat). Control circuit 340 may also generate the Enb control signal with hysteresis in order to avoid continually toggling between enabling and disabling boost converter 180. For example, control circuit 340 may generate the Enb control signal to disable boost converter 180 when (i) the Vth voltage is less than the Vbat voltage for some minimum duration and/or (ii) the Vth voltage is less than the Vbat voltage by at least some minimum amount.

Envelope amplifier 170 should amplify and not compress the Venv signal. This may be ensured by (i) amplifying the Venv signal with the Vboost voltage as a supply voltage whenever necessary and (ii) generating the Vboost voltage to be higher than the peak of the Vout voltage at the output of envelope amplifier 170 plus some headroom. The Vth voltage may be generated based on the peak of the Venv voltage plus the Vhr voltage. The Vboost voltage may be generated based on the Vth voltage (e.g., Vboost≈Vth), which may ensure that envelope amplifier 170 can avoid compression.

FIG. 3 shows an exemplary design in which (i) a variable Vhr voltage is generated based on the I'out current and (ii) the Vth voltage is generated based on the variable Vhr voltage. In this design, the Vhr voltage may be higher for a larger Iout current and lower for a smaller Iout current. This design may result in (i) a larger headroom for envelope amplifier 170 for a larger Iout current, which may improve linearity, or (ii) a smaller headroom for envelope amplifier 170 for a smaller Iout current, which may reduce power consumption. In another exemplary design, the Vth voltage may be generated based on a fixed Vhr voltage. The fixed Vhr voltage may be selected to provide good performance for a range of Vout voltages of interest.

FIG. 3 shows an exemplary design in which the Venv voltage is summed with the Vhr voltage by summer 320 to obtain the Vsum voltage. In another exemplary design, the Vout voltage may be summed with the Vhr voltage by summer 320 to obtain the Vsum voltage. The Vout voltage may be dependent on the Vbat or Vboost voltage and may be distorted when the Vbat or Vboost voltage is not sufficiently high. Hence, summing the Venv voltage (instead of the Vout voltage) with the Vhr voltage may result in a more accurate Vsum voltage.

In another exemplary design, currents (instead of voltages) may be summed by summer 320. In this design, converter 310 may provide a headroom current (instead of a headroom voltage), the Venv voltage may be converted to an envelope current and summed with the headroom current by summer 320, and the summed current may be converted to a summed voltage.

FIG. 3 shows an exemplary design of boost controller 190 in FIG. 1. Boost controller 190 may also be implemented in other manners. In another exemplary design, boost controller 190 may generate the Vth voltage based on a fixed Vhr voltage, and converter 310 may be omitted or replaced with a fixed voltage generator. In yet another exemplary design, peak detector 330 may be located between envelope amplifier 170 and summer 320 (instead of after summer 320). In this design, the Vhr voltage may be summed with the detected peak voltage to obtain the Vth voltage. In yet another exemplary design, peak detector 330 may be omitted, and the Vsum voltage (instead of the Vdet voltage) may be provided to control circuit 340.

The circuits within boost controller 190 in FIG. 1 and boost controller 190x in FIG. 3 may be implemented in various manners. An exemplary design of circuits in a boost controller is described below. In this design, currents (instead of voltages) are summed to obtain a summed current.

Figure 4:
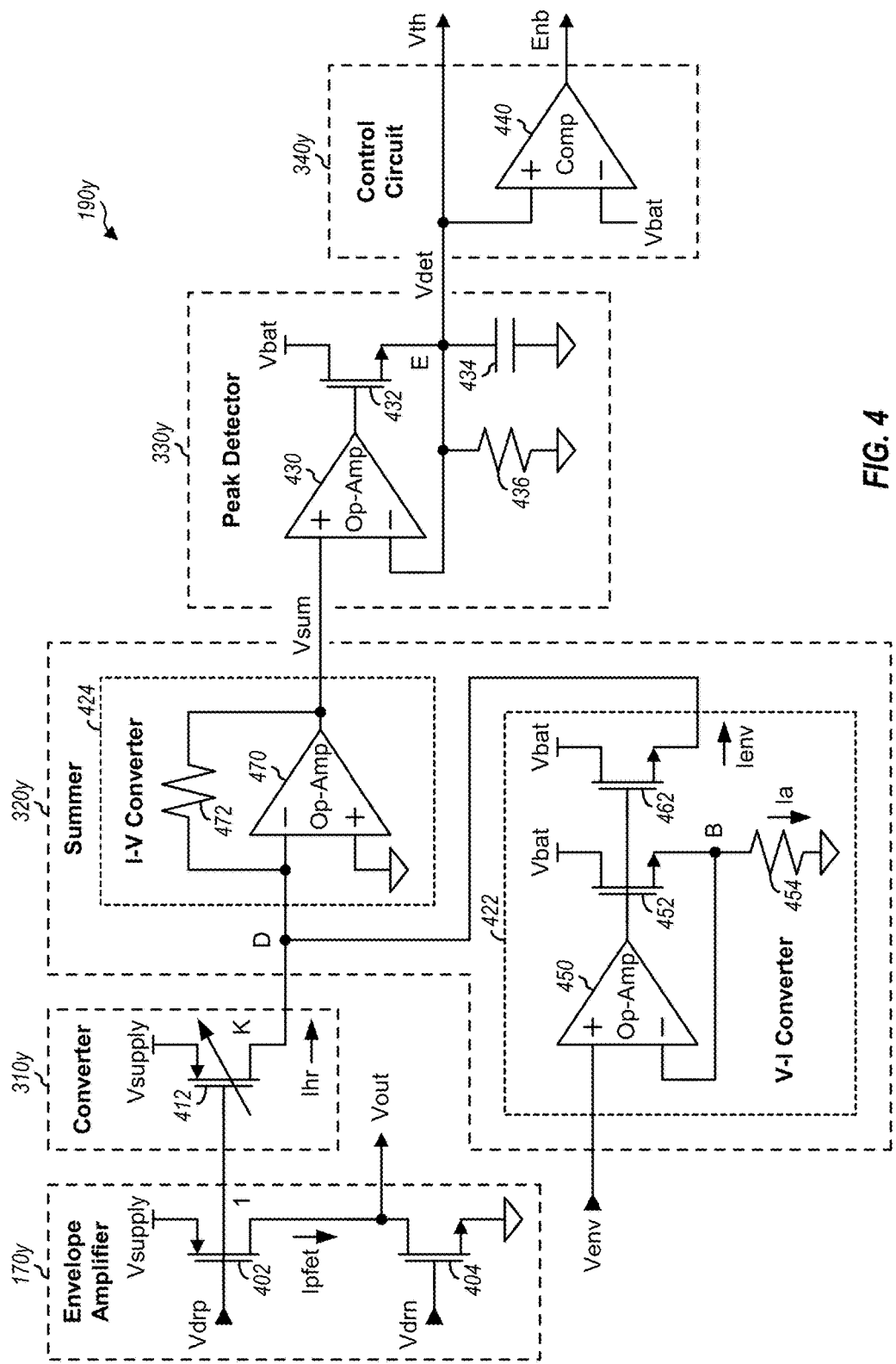
FIG. 4 shows a schematic diagram of a boost controller.

FIG. 4 shows a schematic diagram of a boost controller 190y, which is an exemplary design of boost controller 190 in FIG. 1 and boost controller 190x in FIG. 3. FIG. 4 also shows an output portion of an envelope amplifier 170y, which is an exemplary design of envelope amplifier 170 in FIGS. 1 and 3. In the design shown in FIG. 4, envelope amplifier 170y includes a P-channel metal oxide semiconductor (PMOS) transistor 402 and an N-channel metal oxide semiconductor (NMOS) transistor 404. PMOS transistor 402 has its source coupled to a supply voltage (Vsupply) and its gate receiving a first drive signal (Vdrp). The Vsupply voltage may be the Vbat voltage or the Vboost voltage. NMOS transistor 404 has its source coupled to circuit ground and its gate receiving a second drive signal (Vdrn). The drains of transistors 402 and 404 are coupled together and provide the Vout voltage. In other exemplary designs, PMOS transistor 402 may be replaced with an NMOS transistor or a cascode structure.

In the exemplary design shown in FIG. 4, boost controller 190y includes a converter 310y, a summer 320y, a peak detector 330y, and a control circuit 340y, which are one exemplary design of converter 310, summer 320, peak detector 330, and control circuit 340 in FIG. 3. Converter 310y includes a PMOS transistor 412 having its source coupled to the Vsupply voltage, its gate receiving the Vdrp signal, and its drain providing a headroom current (Ihr) to node D.

Summer 320y includes a voltage-to-current (V-I) converter 422 and a current-to-voltage (I-V) converter 424. Within V-I converter 422, an operational amplifier (op-amp) 450 has its non-inverting input receiving the Venv signal, its inverting input coupled to node B, and its output coupled to the gates of NMOS transistors 452 and 462. NMOS transistor 452 has its drain coupled the Vbat voltage and its source coupled to node B. NMOS transistor 462 has its drain coupled to the Vbat voltage and its source providing an envelope current (Ienv) to node B. A resistor 454 is coupled between node B and circuit ground. Within I-V converter 424, an op-amp 470 has its non-inverting input coupled to circuit ground, its inverting input coupled to node D, and its output providing the Vsum voltage. Op-amp 470 may also have its non-inverting input coupled to a reference voltage instead of circuit ground. A resistor 472 is coupled between the inverting input and the output of op-amp 470.

Peak detector 330y includes an op-amp 430 having its non-inverting input coupled to the output of summer 320y, its inverting input coupled to node E, and its output coupled to the gate of an NMOS transistor 432. NMOS transistor 432 has its drain coupled to the Vbat voltage and its source providing the Vdet voltage at node E, which is the output of peak detector 330y. A capacitor 434 and a resistor 436 are coupled between node E and circuit ground.

Control circuit 340y includes a comparator (Comp) 440 having a non-inverting input coupled to the output of peak detector 330y, an inverting input receiving the Vbat voltage, and an output providing the Enb signal. Control circuit 340y also provides the Vdet voltage as the Vth voltage.

Envelope amplifier 170y generates the Vdrp and Vdrn signals based on the Venv signal such that the Vout voltage at the output of envelope amplifier 170y tracks the Venv signal at the input of envelope amplifier 170y. Envelope amplifier 170y provides a desired Iout current when it is enabled. Envelope amplifier 170y may be a class AB amplifier, which may provide a good tradeoff between good linearity and low power consumption. For a class AB amplifier, either PMOS transistor 402 or NMOS transistor 404 may conduct the load current at any given moment. The MOS transistor that conducts the load current would provide the Iout current as well as a bias current for the MOS transistor that is not conducting the load current. Hence, when PMOS transistor 402 conducts and provides the Iout current, the drain current (Ipfet) of PMOS transistor 402 is approximately equal to the Iout current provided by envelope amplifier 170y, or Ipfet≈Iout.

Boost controller 190y operates as follows. Converter 310y provides a headroom current (Ihr) that is (i) a scaled version of the drain current of PMOS transistor 402 and (ii) proportional to the Tout current provided by envelope amplifier 170y. PMOS transistor 402 within envelope amplifier 170y may have a dimension of W/L, where W is the width and L is the length of PMOS transistor 402. PMOS transistor 412 within converter 310y may have a dimension of K*W/L, where K may be any value. K may be equal to 1, or greater than 1, or less than 1. For example, K may be equal to 0.01 or 0.001, so that the Ihr current is a small fraction of the Tout current. K may be a fixed value or a programmable value. The Ihr current from converter 310y may be expressed as:

$$Ihr \approx K*Iout. \qquad \text{Eq (2)}$$

In the design shown in equation (2), the Ihr current is proportional to the Tout current. Hence, a larger Tout current results in a larger headroom, and vice versa.

V-I converter 422 within summer 320y receives the Venv signal and provides the Ienv current. Op-amp 450 and NMOS transistor 452 are coupled in a feedback loop, which maintains the voltage at node B approximately equal to the Venv voltage. The current (Ia) provided by the source of NMOS transistor 452 may be given as:

$$Ia \approx \frac{Venv}{Rs},$$

where Rs is a resistance value of resistor 454. NMOS transistors 452 and 462 may receive the same gate voltage, have the same dimension, and provide approximately equal source currents. Hence, the source current of NMOS transistor 462 may be expressed as:

$$Ienv \approx \frac{Venv}{Rs}. \qquad \text{Eq (3)}$$

The Ihr current from converter 310y and the Ienv current from V-I converter 422 are summed at node D. The summed current (Isum) may be expressed as:

$$Isum = Ihr + Ienv. \qquad \text{Eq (4)}$$

I-V converter 424 within summer 320y receives the Isum current from node D and provides the summed voltage (Vsum) to peak detector 330y. The Isum current is passed through resistor 472, and the Vsum voltage is determined by the voltage drop across resistor 472 due to the Isum current. The Vsum voltage may be expressed as:

$$Vsum = Rf*Isum, \qquad \text{Eq (5)}$$

where Rf is a resistance value of resistor 472.

Peak detector 330y detects the peak of the Vsum voltage. Within peak detector 330y, op-amp 430 and NMOS transistor 432 are coupled in a feedback loop. When the Vsum voltage exceeds the Vdet voltage, op-amp 430 outputs a high voltage, and NMOS transistor 432 is turned ON. In this case, capacitor 434 is charged to a higher voltage via NMOS transistor 432. Conversely, when the Vsum voltage is below the Vdet voltage, op-amp 430 outputs a low voltage, and NMOS transistor 432 is turned OFF. In this case, capacitor 434 is slowly discharged via resistor 436, and the voltage across capacitor 434 slow drops. The Vdet voltage thus (i) increases quickly to follow a rising Vsum voltage and (ii) decreases slowly for a falling Vsum voltage.

Control circuit 340y receives the Vdet voltage and provides the Vth voltage and the Enb signal. Within control circuit 340y, comparator 440 compares the Vdet voltage against the Vth voltage, outputs a logic high ('1') on the Enb signal when the Vdet voltage exceeds the Vbat voltage, and outputs a logic low ('0') on the Enb signal when the Vdet voltage is below the Vbat voltage. Control circuit 340y may also generate the Enb signal with time and/or voltage level hysteresis, as described above.

FIG. 4 shows an exemplary design of circuits within boost controller 190y. The circuits in a boost controller may also be implemented in other manners. In general, boost controller 190 may control the operation of boost converter 180 in order to avoid compressing the Vout signal by envelope amplifier 170 and to conserve battery power. Boost controller 190 may generate the Vth voltage and the Enb signal based on the Iout current and the Venv signal, e.g., as shown in FIGS. 3 and 4. Boost controller 190 may generate the Enb signal to enable boost converter 180 when the Vbat voltage is not sufficiently high. Furthermore, boost controller 190 may provide the Vth voltage such that the Vboost voltage is (i) sufficiently high in order to avoid compression of the Vout signal but (ii) not too high in order to reduce power consumption. The Vth voltage may be higher than the peak of the Vout signal plus a sufficient headroom for envelope amplifier 170. The headroom may be a function of the output current from envelope amplifier 170.

Adjusting the headroom based on the output current of envelope amplifier 170 may ensure good performance in various operating scenarios. For example, in a Long Term Evolution (LTE) system, wireless device 100 may transmit an uplink signal on one resource block (RB), which may cover 12 subcarriers in 180 KHz within a system bandwidth that is within a range of 1.44 to 20 MHz. A 1-RB waveform for the uplink signal may have a very slow peak. In this case, inductor 162 may run out of current and envelope amplifier 170 may have to momentarily provide all of the load current. More voltage headroom may ensure that envelope amplifier 170 can (i) provide all of the load current even with a slow peak of the 1-RB waveform and (ii) maintain good efficiency for faster waveforms.

Figure 5:
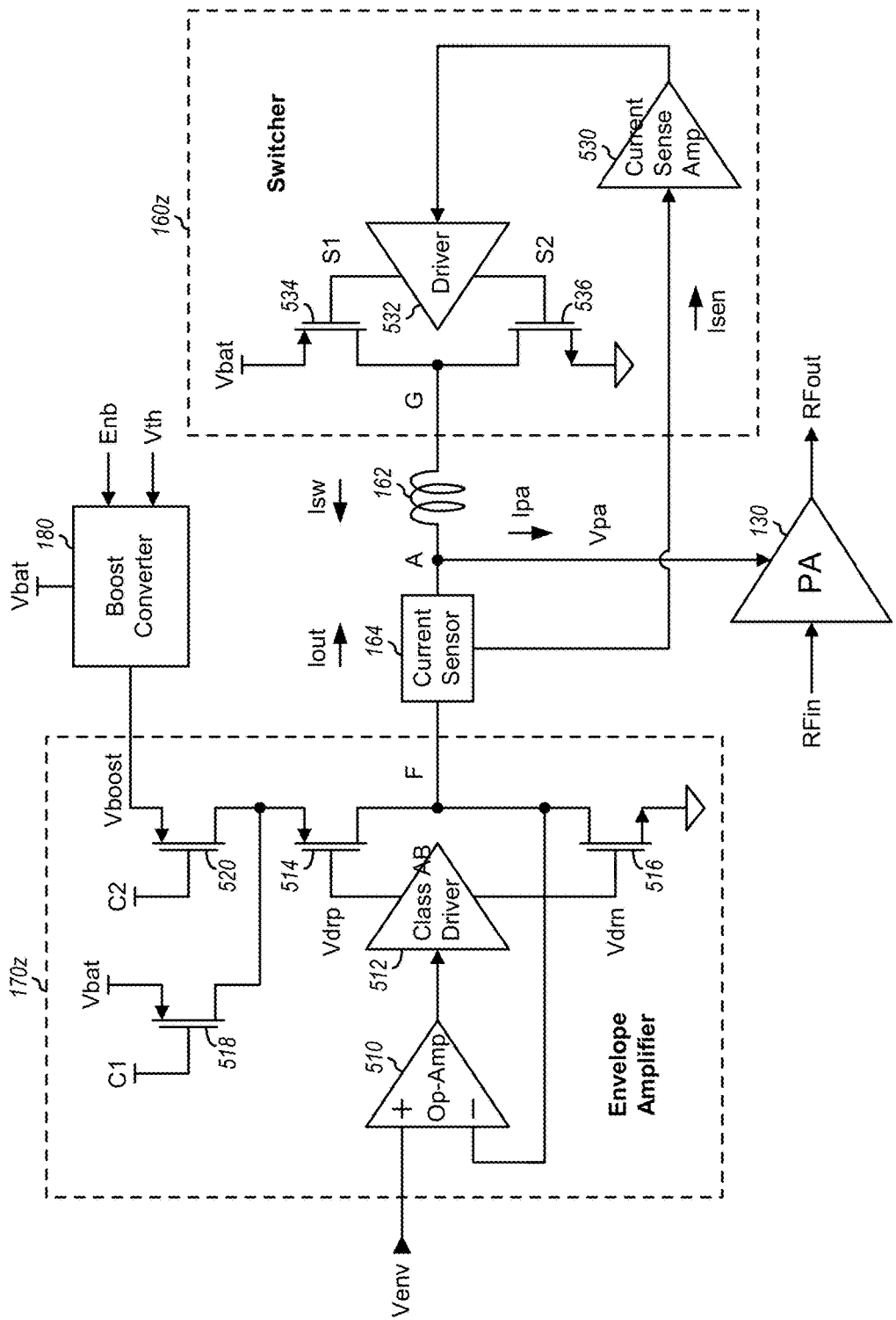
FIG. 5 shows a schematic diagram of a switcher and an envelope amplifier.

FIG. 5 shows a schematic diagram of a switcher 160z and an envelope amplifier 170z, which are an exemplary design of switcher 160 and envelope amplifier 170, respectively, in FIG. 1. Within envelope amplifier 170z, an op-amp 510 has its non-inverting input receiving the Venv signal, its inverting input coupled to an output of envelope amplifier 170z (which is node F), and its output coupled to an input of a class AB driver 512. Driver 512 has (i) its first output coupled to the gate of a PMOS transistor 514 and providing the Vdrp signal and (ii) its second output coupled to the gate of an NMOS transistor 516 and providing the Vdrn signal. NMOS transistor 516 has its drain coupled to node F and its source coupled to circuit ground. PMOS transistor 514 has its drain coupled to node F and its source coupled to the drains of PMOS transistors 518 and 520. PMOS transistor 518 has its gate receiving a C1 control signal and its source receiving the Vbat voltage. PMOS transistor 520 has its gate receiving a C2 control signal and its source receiving the Vboost voltage.

In the exemplary design shown in FIG. 5, a current sensor 164 is coupled between node F and node A and senses the Iout current provided by envelope amplifier 170z. Sensor 164 passes most of the Iout current to node A and provides a small sensed current (Isen) to switcher 160z. The Isen current is a small fraction of the Iout current from envelope amplifier 170z. In another exemplary design, current sensor 164 may be implemented with a PMOS transistor coupled in parallel with PMOS transistor 514 and receiving the Vdrp signal, e.g., similar to PMOS transistor 412 in FIG. 4.

Within switcher 160z, a current sense amplifier 530 has its input coupled to current sensor 164 and its output coupled to an input of a switcher driver 532. Driver 532 has its first output (S1) coupled to the gate of a PMOS transistor 534 and its second output (S2) coupled to the gate of an NMOS transistor 536. NMOS transistor 536 has its drain coupled to an output of switcher 160z (which is node G) and its source coupled to circuit ground. PMOS transistor 534 has its drain coupled to node G and its source receiving the Vbat voltage. Inductor 162 is coupled between nodes A and G.

Switcher 160z operates as follows. Switcher 160z is in an ON state when current sensor 164 senses a high output current from envelope amplifier 170z and provides a low sensed voltage to driver 532. Driver 532 then provides a low voltage to the gate of PMOS transistor 534 and a low voltage to the gate of NMOS transistor 536. PMOS transistor 534 is turned on and couples the Vbat voltage to inductor 162, which stores energy from the Vbat voltage. The current through inductor 162 rises during the ON state, with the rate of the rise being dependent on (i) the difference between the Vbat voltage and the Vpa voltage at node A and (ii) the inductance of inductor 162. Conversely, switcher 160z is in an OFF state when current sensor 164 senses a low output current from envelope amplifier 170z and provides a high sensed voltage to driver 532. Driver 532 then provides a high voltage to the gate of PMOS transistor 534 and a high voltage to the gate of NMOS transistor 536. NMOS transistor 536 is turned on, and inductor 162 is coupled between node A and circuit ground. The current through inductor 162 falls during the OFF state, with the rate of the fall being dependent on the Vpa voltage at node A and the inductance of inductor 162. The Vbat voltage thus provides current to power amplifier 130 via inductor 162 during the ON state, and inductor 162 provides its stored energy to power amplifier 130 during the OFF state. For the 1-RB waveform described above, the current in inductor 162 may fall to zero during a peak, and envelope amplifier 170z may provide all of the load current. In this case, a sufficiently large headroom may ensure that envelope amplifier 170z can provide the desired load current.

Envelope amplifier 170z may operate based on the Vboost voltage only when needed and based on the Vbat voltage the remaining time in order to improve efficiency. For example, envelope amplifier 170z may provide approximately 85% of the power based on the Vbat voltage and only approximately 15% of the power based on the Vboost voltage. When a high Vpa voltage is needed for power amplifier 130 due to a large envelope of the RFout signal, the Enb signal is at logic high (e.g., Vbat), the C1 control signal is at logic high (e.g., Vbat), and the C2 control signal is at logic low (e.g., 0V). In this case, boost converter 180 is enabled and generates the Vboost voltage, PMOS transistor 520 is turned on and provides the Vboost voltage to the source of PMOS transistor 514, and PMOS transistor 518 is turned off. Conversely, when a high Vpa voltage is not needed for power amplifier 130, the Enb signal is at logic low, the C1 control signal is at logic low, and the C2 control signal is at logic high. In this case, boost converter 180 is disabled, PMOS transistor 520 is turned off, and PMOS transistor 518 is turned on and provides the Vbat voltage to the source of PMOS transistor 514. The C1 and C2 control signals may be generated based on the Enb control signal, e.g., C1=Enb, and C2=inverted (Enb).

Envelope amplifier 170z operates as follows. When the envelope signal increases, the output of op-amp 510 increases, the Vdrp signal deceases and the Vdrn signal decreases until NMOS transistor 516 is almost turned off, and the output of envelope amplifier 170z increases. The converse is true when the envelope signal decreases. The negative feedback from the output of envelope amplifier 170z to the inverting input of op-amp 510 results in envelope amplifier 170z having unity gain. Hence, the output of envelope amplifier 170z follows the envelope signal, and the Vpa voltage is approximately equal to the envelope signal. Driver 512 may be implemented with a class AB amplifier in order to improve efficiency, so that large output currents can be supplied even with a small bias current for MOS transistors 514 and 516.

FIG. 5 shows an exemplary design of switcher 160 and envelope amplifier 170 in FIG. 1. Switcher 160 and envelope amplifier 170 may also be implemented in other manners. For example, switcher 160 may include a summer that receives and sums the Isen current and an offset current and provides a summed current to current sense amplifier 530. The summed current may be lower than the Isen current by the offset current, so that switcher 160 is turned on for a longer time period and can provide a larger Iind current for power amplifier 130. Envelope amplifier 170 may be implemented as described in U.S. Pat. No. 6,300,826, entitled "Apparatus and Method for Efficiently Amplifying Wideband Envelope Signals," issued Oct. 9, 2001.

Switcher 160z has high efficiency and delivers a majority of the supply current for power amplifier 130. Envelope amplifier 170z operates as a linear stage and has relatively high bandwidth (e.g., in the MHz range). Switcher 160z operates to reduce the output current from envelope amplifier 170z, which improves overall efficiency.

Figure 6:
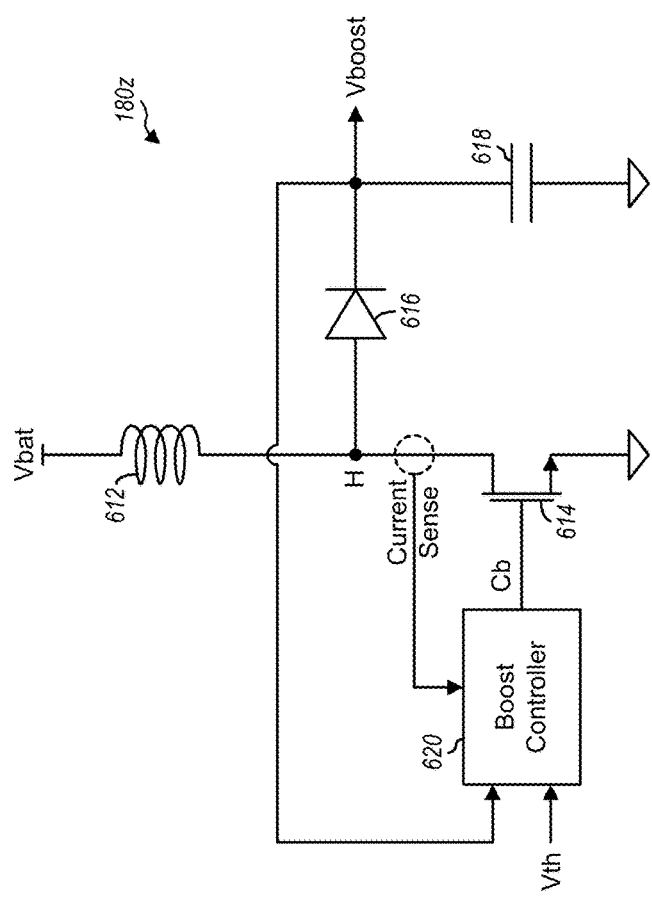
FIG. 6 shows a schematic diagram of a boost converter.

FIG. 6 shows a schematic diagram of a boost converter 180z, which is an exemplary design of boost converter 180 in FIG. 1. Within boost converter 180z, an inductor 612 has one end receiving the Vbat voltage and the other end coupled to node H. An NMOS transistor 614 has its source coupled to circuit ground, its gate receiving a Cb control signal, and its drain coupled to node H. A diode 616 has its anode coupled to node H and its cathode coupled to the output of boost converter 180z. A capacitor 618 has one end coupled to circuit ground and the other end coupled to the output of boost converter 180z. A boost controller 620 receives the Vth voltage, the Vboost voltage, and a sensed current at the drain of NMOS transistor 614. Boost controller 620 generates the Cb control signal based on the Vth and Vboost voltages and the sensed current. The Cb control signal turns on or off NMOS transistor 614.

Boost converter 180z operates as follows. In an ON state, NMOS transistor 614 is closed, inductor 612 is coupled between the Vbat voltage and circuit ground, and the current via inductor 612 increases. In an OFF state, NMOS transistor 614 is opened, and the current from inductor 612 flows via diode 616 to capacitor 618 and a load at the output of boost converter 180 (not shown in FIG. 6). The Vboost voltage may be expressed as:

$$Vboost = Vbat \cdot \frac{1}{1 - \text{Duty\_Cycle}}, \quad \text{Eq (6)}$$

and $$\text{Duty\_Cycle} = \left(1 - \frac{Vbat}{Vboost}\right), \quad \text{Eq (7)}$$

where Duty_Cycle is the duty cycle in which NMOS transistor 614 is turned on.

Boost controller 620 generates the Cb control signal with the proper duty cycle in order to obtain the desired Vboost voltage and to ensure proper operation of boost converter 180. Boost controller 620 may compare the Vboost voltage against the Vth voltage and may generate the Cb control signal such that the Vboost voltage matches the Vth voltage. Boost controller 620 may include a comparator and/or other circuits. The sensed current may ensure stability of the control loop.

In an exemplary design, an apparatus (e.g., an integrated circuit, a wireless device, a circuit module, etc.) may include an amplifier and a boost converter, e.g., as shown in FIG. 1. The amplifier (e.g., envelope amplifier 170) may receive an envelope signal and a variable boosted supply voltage and provide an output voltage and an output current. The boost converter (e.g., boost converter 180) may receive a power supply voltage (e.g., a battery voltage) and at least one signal determined based on the envelope signal and may generate the variable boosted supply voltage based on the power supply voltage and the at least one signal.

The apparatus may further include a boost controller (e.g., boost controller 190), which may generate the at least one signal for the boost converter based on the envelope signal and/or the output voltage. The boost controller may generate an enable signal based on the envelope signal and/or the output voltage. Alternatively or additionally, the boost controller may generate a threshold voltage for the boost converter based on the envelope signal and/or the output voltage. The at least one signal may comprise the enable signal and/or the threshold voltage. The boost converter may be enabled or disabled based on the enable signal. The boost converter may generate the variable boosted supply voltage based on the power supply voltage and the threshold voltage.

In an exemplary design, the boost controller may generate the threshold voltage based further on a headroom, which may be a headroom voltage or a headroom current. The boost controller may determine the headroom based on the output current from the amplifier, or a programmable scaled version of the output current, or some other quantity. The boost controller may determine a summed voltage based on the headroom and the envelope signal and/or the output voltage, detect a peak of the summed voltage, and determine the threshold voltage based on the detected peak of the summed voltage. The boost controller may also generate the enable signal based on the detected peak of the summed voltage. For example, the boost controller may generate the enable signal to (i) enable the boost converter when the detected peak of the summed voltage exceeds the power supply voltage or (ii) disable the boost converter when the detected peak of the summed voltage falls below the power supply voltage. The boost controller may also generate the enable signal to disable the boost converter when the detected peak of the summed voltage falls below the power supply voltage for a predetermined amount of time and/or by a predetermined amount.

In an exemplary design, the boost controller may include a converter, a summer, a peak detector, and a control circuit. The converter (e.g., converter 310 in FIG. 3) may determine the headroom based on the output current. The summer (e.g., summer 320) may sum the headroom and the envelope signal or the output voltage and provide a summed voltage. The peak detector (e.g., peak detector 330) may detect a peak of the summed voltage and provide a detected peak voltage. The control circuit (e.g., control circuit 340) may determine the threshold voltage and/or the enable signal based on the detected peak voltage.

Figure 7:
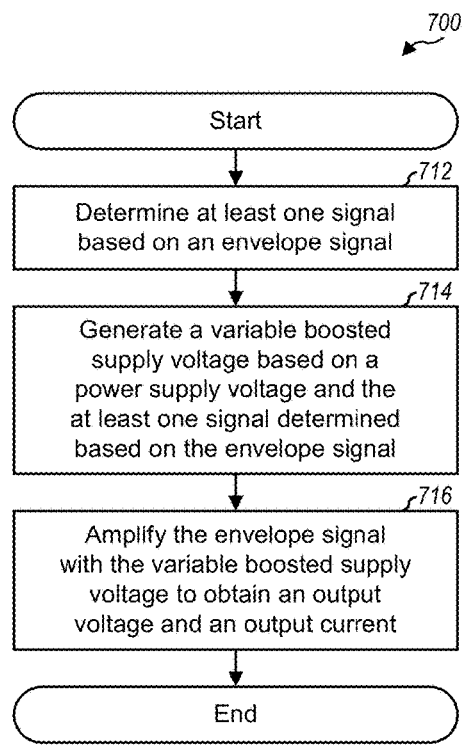
FIG. 7 shows a process for generating a variable boosted supply voltage.

FIG. 7 shows an exemplary design of a process 700 for generating a variable boosted supply voltage. At least one signal may be determined based on an envelope signal (block 712). A variable boosted supply voltage may be generated based on a power supply voltage and the at least one signal determined based on the envelope signal (block 714). The envelope signal may be amplified with the variable boosted supply voltage to obtain an output voltage and an output current (block 716).

In an exemplary design, an enable signal may be generated based on the envelope signal and/or the output voltage. Alternatively or additionally, a threshold voltage may be generated based on the envelope signal and/or the output voltage. The threshold voltage may also be generated based further on a headroom. The at least one signal may comprise the enable signal and/or the threshold voltage. The variable boosted supply voltage may be generated based on the power supply voltage and the threshold voltage. Generation of the variable boosted supply voltage may be enabled or disabled based on the enable signal.

Figure 8:
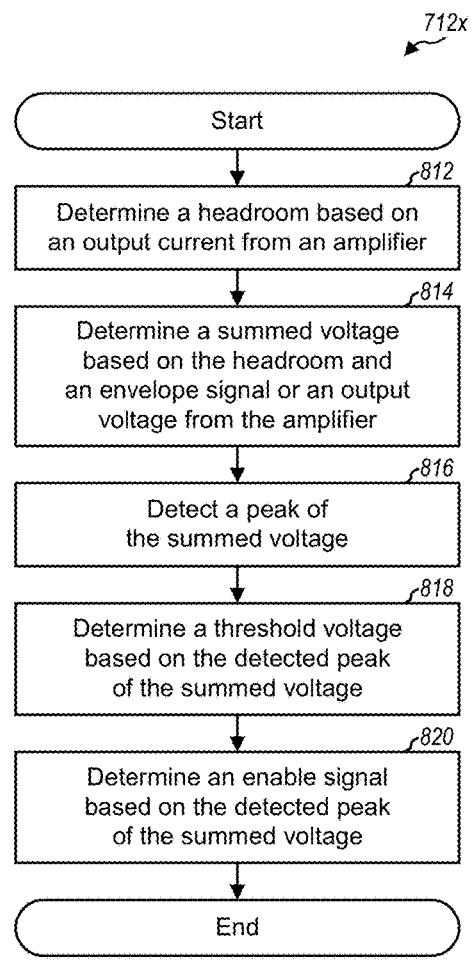
FIG. 8 shows an exemplary design of a process for generating the a signal to control a boost converter.

FIG. 8 shows an exemplary design of a process 712x for generating the at least one signal to control a boost converter. Process 712x may be used for step 712 in FIG. 7. A headroom may be determined based on an output current of an amplifier (block 812). A summed voltage may be determined based on the headroom and an envelope signal provided to the amplifier and/or an output voltage from the amplifier (block 814). A peak of the summed voltage may be detected (block 816). A threshold voltage may be determined based on the detected peak of the summed voltage (block 818). An enable signal may also be generated based on the detected peak of the summed voltage (block 820).

The circuits (e.g., envelope amplifier, boost converter, boost controller, etc.) described herein may be implemented on an IC, an analog IC, an RFIC, a mixed-signal IC, an ASIC, a printed circuit board (PCB), an electronic device, etc. The circuits may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an amplifier configured to receive an envelope signal and a variable boosted supply voltage and to provide an output voltage and an output current;
   a boost converter configured to receive a power supply voltage and at least one signal determined based on the envelope signal and to generate the variable boosted supply voltage based on the at least one signal; and
   a boost controller configured to generate the at least one signal for the boost converter based on the envelope signal or the output voltage,
   wherein the boost controller is configured to generate a threshold voltage for the boost converter based at least in part on the output current, wherein the at least one signal comprises the threshold voltage.

2. The apparatus of claim 1, wherein the boost controller is configured to generate an enable signal based on the envelope signal or the output voltage, wherein the at least one signal comprises the enable signal, and wherein the boost converter is enabled or disabled based on the enable signal.

3. The apparatus of claim 1, wherein the boost controller is configured to generate the threshold voltage based further on a headroom.

4. The apparatus of claim 3, wherein the boost controller is configured to determine the headroom based on the output current from the amplifier.

5. The apparatus of claim 3, wherein the boost controller is configured to determine the headroom based on a proportional factor of the output current from the amplifier.

6. The apparatus of claim 3, wherein the boost controller is configured to determine a summed voltage based on the headroom and the envelope signal or the output voltage, to detect a peak of the summed voltage, and to determine the threshold voltage based on the detected peak of the summed voltage.

7. The apparatus of claim 6, wherein the boost controller is configured to generate an enable signal based on the detected peak of the summed voltage, wherein the at least one signal comprises the enable signal, and wherein the boost converter is enabled or disabled based on the enable signal.

8. The apparatus of claim 7, wherein the boost controller is configured to generate the enable signal to enable the boost converter when the detected peak of the summed voltage exceeds the power supply voltage and to disable the boost converter when the detected peak of the summed voltage falls below the power supply voltage.

9. The apparatus of claim 8, wherein the boost controller is configured to generate the enable signal to disable the boost converter when the detected peak of the summed voltage falls below the power supply voltage for a predetermined amount of time, or by a predetermined amount, or both.

10. An apparatus comprising:
an amplifier configured to receive an envelope signal and a variable boosted supply voltage and to provide an output voltage and an output current;
a boost converter configured to receive a power supply voltage and at least one signal determined based on the envelope signal and to generate the variable boosted supply voltage based on the power supply voltage and the at least one signal; and
a boost controller configured to generate the at least one signal for the boost converter based on the envelope signal or the output voltage, wherein the boost controller comprises:
a converter configured to determine a headroom based on the output current;
a summer configured to sum the headroom and the envelope signal or the output voltage and provide a summed voltage; and
a peak detector configured to detect a peak of the summed voltage and provide a detected peak voltage.

11. The apparatus of claim 10, the boost controller further comprising: a control circuit configured to determine a threshold voltage based on the detected peak voltage, wherein the at least one signal comprises the threshold voltage, and wherein the boost converter is configured to generate the variable boosted supply voltage based on the power supply voltage and the threshold voltage.

12. The apparatus of claim 11, wherein the control circuit is configured to determine an enable signal based on the detected peak voltage, wherein the at least one signal comprises the enable signal, and wherein the boost converter is enabled or disabled based on the enable signal.

13. A method comprising:
generating a variable boosted supply voltage based on at least one signal determined based on an envelope signal;
amplifying the envelope signal with the variable boosted supply voltage to obtain an output voltage and an output current; and
generating a threshold voltage based at least in part on the output current, wherein the at least one signal comprises the threshold voltage, and wherein the variable boosted supply voltage is generated based on the threshold voltage.

14. The method of claim 13, further comprising:
generating an enable signal based on the envelope signal or the output voltage, wherein the at least one signal comprises the enable signal, and wherein generation of the variable boosted supply voltage is enabled or disabled based on the enable signal.

15. The method of claim 13, wherein the generating the threshold voltage comprises generating the threshold voltage based further on a headroom.

16. The method of claim 15, further comprising:
determining the headroom based on the output current, wherein the headroom is a proportional factor of the output current.

17. The method of claim 13, wherein the generating the threshold voltage comprises:
determining a headroom based on the output current,
determining a summed voltage based on the headroom and the envelope signal or the output voltage,
detecting a peak of the summed voltage, and
determining the threshold voltage based on the detected peak of the summed voltage.

18. An apparatus comprising:
means for generating a variable boosted supply voltage based on at least one signal determined based on an envelope signal;
means for amplifying the envelope signal with the variable boosted supply voltage to obtain an output voltage and an output current; and
means for generating a threshold voltage based at least in part on the output current, wherein the at least one signal comprises the threshold voltage, and wherein the variable boosted supply voltage is generated based on the threshold voltage.

19. The apparatus of claim 18, further comprising:
means for generating an enable signal based on the envelope signal or the output voltage, wherein the at least one signal comprises the enable signal, and wherein generation of the variable boosted supply voltage is enabled or disabled based on the enable signal.

20. The apparatus of claim 18, wherein the means for generating the threshold voltage comprises means for generating the threshold voltage based further on a headroom.

21. The apparatus of claim 18, wherein the means for generating the threshold voltage comprises:
means for determining a headroom based on the output current, means for determining a summed voltage based on the headroom and the envelope signal or the output voltage,
means for detecting a peak of the summed voltage, and
means for determining the threshold voltage based on the detected peak of the summed voltage.

22. An apparatus comprising:
an amplifier configured to receive an envelope signal and a variable boosted supply voltage and to provide an output voltage and an output current;
a boost converter configured to receive a power supply voltage and at least one signal determined based on the envelope signal and to generate the variable boosted supply voltage based at least in part on the output current.

* * * * *